(12) United States Patent
Lee

(10) Patent No.: US 8,423,865 B2
(45) Date of Patent: Apr. 16, 2013

(54) APPARATUS AND METHOD FOR STORING DATA USING NON-VOLATILE BUFFER

(75) Inventor: Hyung-Gyu Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 265 days.

(21) Appl. No.: 12/842,657

(22) Filed: Jul. 23, 2010

(65) Prior Publication Data

US 2011/0119569 A1    May 19, 2011

(30) Foreign Application Priority Data

Nov. 18, 2009  (KR) .................. 10-2009-0111564

(51) Int. Cl.
*G06F 11/00*    (2006.01)

(52) U.S. Cl.
USPC .......................................... 714/763; 714/764

(58) Field of Classification Search .................. 714/763, 714/764, 768, 42, 54, 702
See application file for complete search history.

(56) References Cited

U.S. PATENT DOCUMENTS

| 6,035,347 | A   | 3/2000  | Beardsley et al. |         |
|-----------|-----|---------|------------------|---------|
| 6,711,043 | B2* | 3/2004  | Friedman et al.  | 365/51  |
| 7,164,608 | B2  | 1/2007  | Lee              |         |
| 7,330,995 | B2  | 2/2008  | Shiraishi et al. |         |
| 7,599,210 | B2  | 10/2009 | Okazaki et al.   |         |
| 7,716,422 | B2  | 5/2010  | Shin et al.      |         |
| 2003/0033573 | A1* | 2/2003 | Tamura et al.   | 714/763 |
| 2004/0076046 | A1  | 4/2004 | Brucklmayr et al. |       |
| 2006/0015698 | A1  | 1/2006 | Kim et al.       |         |
| 2007/0150654 | A1  | 6/2007 | Shin et al.      |         |
| 2008/0126694 | A1  | 5/2008 | Song et al.      |         |
| 2008/0266957 | A1* | 10/2008| Moogat et al.    | 365/185.09 |
| 2008/0276040 | A1  | 11/2008| Moritoki         |         |

FOREIGN PATENT DOCUMENTS

| KR | 10-1999-0085605 | 12/1999 |
| KR | 10-2006-0040857 | 5/2006  |
| KR | 10-2006-0043818 | 5/2006  |
| KR | 10-2007-0021920 | 2/2007  |
| KR | 10-2007-0068796 | 7/2007  |
| KR | 10-2007-0068807 | 7/2007  |
| KR | 10-0800484      | 2/2008  |

* cited by examiner

*Primary Examiner* — Dieu-Minh Le (74) *Attorney, Agent, or Firm* — NSIP Law (57) ABSTRACT

An apparatus and method for storing data using a non-volatile buffer. A first data is stored in a first non-volatile buffer according to a first input/output request. The first data stored in the first non-volatile buffer is written into a memory cell while a second data is being stored in a second non-volatile buffer according to a second input/output request.

18 Claims, 8 Drawing Sheets

APPARATUS AND METHOD FOR STORING DATA USING NON-VOLATILE BUFFER

CROSS-REFERENCE TO RELATED APPLICATION(S)

This application claims the benefit under 35 U.S.C. § 119(a) of Korean Patent Application No. 10-2009-0111564, filed on Nov. 18, 2009, the disclosure of which is incorporated herein by reference in its entirety for all purposes.

BACKGROUND

1. Field

The following description relates to a memory device and data atomicity.

2. Description of the Related Art

A non-volatile memory is a storage device that can retain stored data even when power supply thereto is removed. Such non-volatile memory, which retains the stored data regardless of power supply, is appropriate for use storing important data files or system data.

However, when unexpected power shutdown occurs during a process of storing data in a non-volatile memory, the atomicity of data can not be guaranteed. In other words, the write process may not have been completed, leading to potential errors in the data and invalid data states. That is, if power supply is removed before a write operation is completed, the non-volatile memory retains incomplete data that neither matches the previously stored value nor the new value. Such incomplete data remains even after power is resumed and causes complications during system recovery.

In order to prevent incomplete data from being formed, a journaling or logging may be used when storing important data in a non-volatile memory. Logging is a representative technology for recovering data stored in a database. According to the logging technology, when any change occurs to data, contents before and after the change are stored in order for logs to be kept. Physically, a log is a file of updates done to the database, stored in non-volatile storage. If the database is found to be in an inconsistent state or was not previously properly shut down, the database logs can be reviewed for uncommitted transactions changes made by these transactions can be undone. Additionally, transactions that are already committed but for which changes did not yet appear in the database are redone.

However, such a scheme may increase the complexity of a software design of a system and may degrade system performance. In addition, such a scheme is available for a disk or NAND Flash read/written in sectors or block units, causing a difficulty in application to next generation non-volatile memories read/written in byte units.

SUMMARY

In one general aspect, there is provided an apparatus for storing data using a non-volatile buffer, the apparatus including: a memory cell, at least two non-volatile buffers configured to store data to be written into the memory cell, and a controller configured to: store first data in a first non-volatile buffer according to a first input/output (I/O) request, and control the first non-volatile buffer such that the first data stored in the first non-volatile buffer is written into the memory cell while storing a second data in a second non-volatile buffer according to a second input/output (I/O) request.

The apparatus may further include that the controller is further configured to add an error detection code (EDC) to the first data and the second data.

The apparatus may further include that the controller is further configured to initialize the non-volatile buffer based on the error detection code.

The apparatus may further include that the controller includes status information corresponding to the non-volatile buffer.

The apparatus may further include that the memory cell is integrally formed with the non-volatile buffer.

The apparatus may further include that the controller is integrally formed with the non-volatile buffer.

The apparatus may further include that the controller is further configured to control the first non-volatile buffer such that the second data stored in the second non-volatile buffer is written into the memory cell while storing a third data in the first non-volatile buffer according to a third input/output (I/O) request.

In another general aspect, there is provided a method of storing data using a non-volatile buffer, the method including: storing first data in a first non-volatile buffer according to a first input/output (I/O) request, and writing the first data stored in the first non-volatile buffer into a memory cell while storing second data in a second non-volatile buffer according to a second input/output (I/O) request.

The method may further include that the first and second data stored in the non-volatile buffer each include an error detection code (EDC).

The method may further include initializing the first non-volatile buffer or the second non-volatile buffer based on the error detection code.

The method may further include adding an error detection code (EDC) to each of the first and second data stored in the non-volatile buffer.

The method may further include initializing the first non-volatile buffer or the second non-volatile buffer based on the error detection code.

The method may further include writing the second data stored in the second non-volatile buffer into a memory cell while storing third data in the first non-volatile buffer according to a third input/output (I/O) request.

In another general aspect, there is provided an apparatus for storing data using a non-volatile buffer, the apparatus including: a memory cell, at least two non-volatile buffers configured to store data to be written into the memory cell, and a controller configured to: upon initialization, examine the contents of each non-volatile buffer for a respective error correction code (EDC), and in response to the EDC indicating an error occurring, delete the data from the non-volatile buffer containing the EDC indicating an error.

The apparatus may further include that the controller is further configured to set buffer status information indicating the availability of each non-volatile buffer.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, descriptions of well-known functions and constructions may be omitted for increased clarity and conciseness.

Hereinafter, detailed examples will be described with reference to accompanying drawings.

Figure 1:
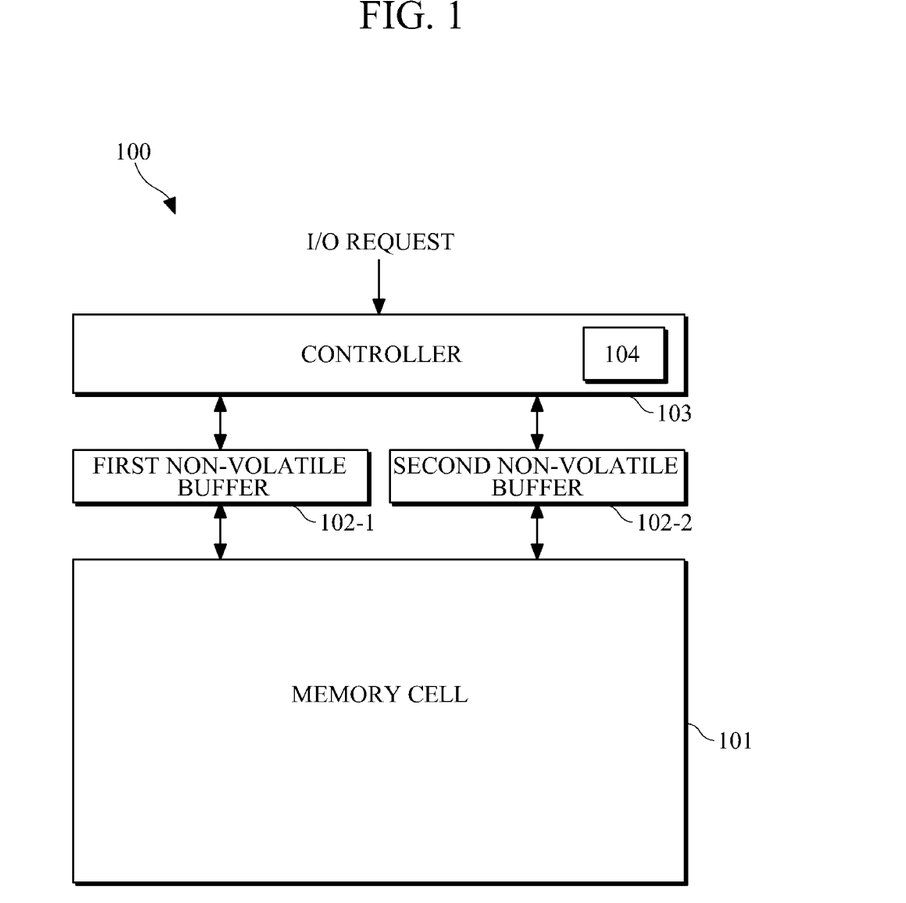
FIG. 1 is an example of an apparatus for storing data.

FIG. 1 shows an example of an apparatus for storing data.

As shown in FIG. 1, a data storing apparatus 100 includes a memory cell 101, a plurality of non-volatile buffers (NV buffers) 102-1 and 102-2, and a controller 103.

The memory cell 101 may be implemented as a non-volatile storage unit capable of storing a large amount of data. For example, the memory cell 101 may be a type of random access memory (RAM), e.g., a phase change RAM (PRAM or PCRAM), a magneto-resistive RAM (MRAM), or a ferroelectric RAM (FeRAM), that is capable of performing read/write operations in byte units.

In addition, the memory cell 101 may include a plurality of storage elements, a bit line, and a word line, in which the bit line and word line are formed between the storage elements and cross each other. The bit and word lines may also be referred to as column and row lines, respectively. The memory cell 101 may further include a row decoder and a column decoder that are used to select a predetermined storage element.

The non-volatile buffers 102-1 and 102-2 may temporarily store data to be written in the memory cell 101 or may temporarily store data read from the memory cell 101.

A non-volatile buffer is capable of retaining stored data regardless of existence of a power supply. Accordingly, even if power supply is removed when data is temporarily stored in the non-volatile buffers 102-1 and 102-2, the data stored in the non-volatile buffers 102-1 and 102-2 may be retained without being deleted.

Although the example of the non-volatile buffers 102-1 and 102-2 includes two non-volatile buffers, there may be two or more non-volatile buffers. The non-volatile buffers 102-1 and 102-2 may operate independently to each other. The illustrated example is nonlimiting.

The controller 103 may control the memory cell 101 and the non-volatile buffers 102-1 and 102-2 to process a data input/output (I/O) request of a host. For example, the controller 103 may receive an I/O request from a host, and may write data into the memory cell or read data from the memory cell according to the received I/O request.

According to an example of the data storing apparatus, a process of storing data in the non-volatile buffers 102-1 and 102-2 and a process of writing data from the non-volatile buffers 102-1 and 102-2 into the memory cell 101 may be executed in a parallel manner. Upon receiving a first I/O request, the controller 103 may store first data in a first non-volatile buffer 102-1 according to the received first I/O request. At this time, the first data may not be written into the memory cell 101. That is, in response to the first I/O request, the first data may not be written into the memory cell 101 and may be stored in the first non-volatile buffer 102-1. After that, upon receiving a second I/O request different from the first I/O request, the controller 103 may store second data in a second non-volatile buffer 102-2 according to the received second I/O request. While the second data is being stored in the second non-volatile buffer 102-2, the controller 103 may write the first data stored in the first non-volatile buffer into the memory cell 101.

For example, in response to the controller 103 receiving a predetermined I/O request, the controller 103 may determine an available non-volatile buffer with reference to buffer-status information 104, e.g., the first non-volatile buffer 102-1; may temporarily store data in the determined non-volatile buffer, e.g., the first non-volatile buffer 102-1; and may update the buffer-status information 104. The buffer status information 104 may be a registry value indicating information about an available non-volatile buffer or an empty non-volatile buffer. After that, in response to the controller 102 receives another I/O request, the controller 103 may determine an available non-volatile buffer with reference to the buffer-status information, e.g., the second non-volatile buffer 102-2; may temporarily store data in the determined non-volatile buffer, e.g., the second non-volatile buffer 102-2; may transfer the data previously stored in the non-volatile buffer, e.g., the first non-volatile buffer 102-1, to the memory cell 101; and may update the buffer-status information 104.

In addition, in response to the controller 103 storing data in the non-volatile buffers 102-1 and 102-2, the controller 103 may add an error detection code (EDC) to the data to be stored in the non-volatile buffers 102-1 and 102-2. The EDC may be, for example, information indicating the correctness, accuracy, completeness, or error existence of data. Accordingly, when a system is reset or abnormally shut down, the controller 103 may initialize a corresponding buffer based on the EDC. It should be appreciated that the first and second non-volatile buffers 102-1 and 102-2 may be interchangeable, as may be the case with any additional non-volatile buffers.

Figure 2A:
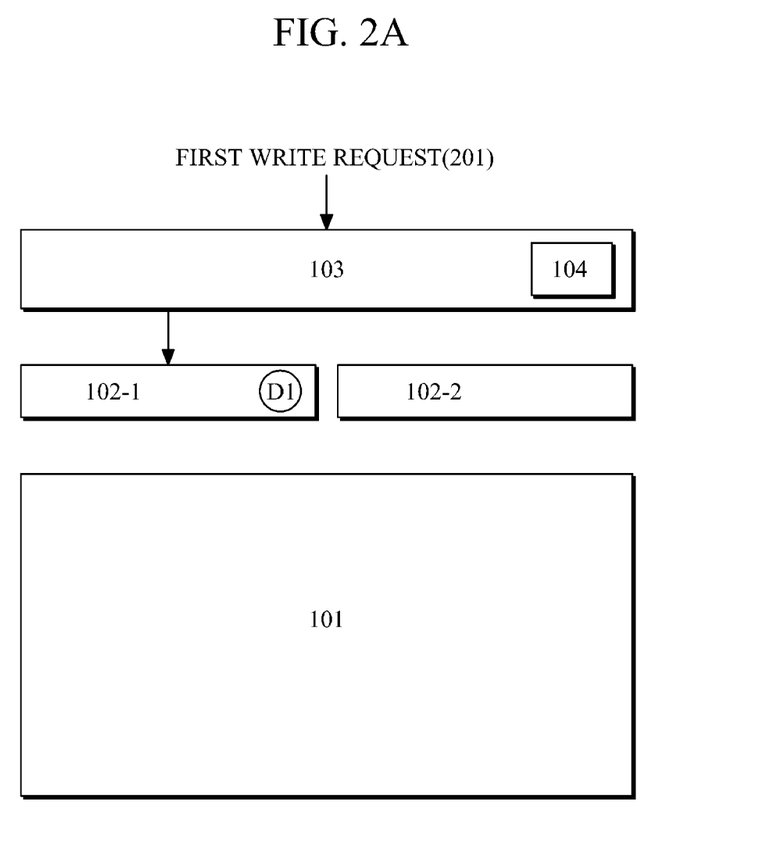
FIGS. 2A to 2C are operations for an example of an apparatus for storing data.
Figure 2B:
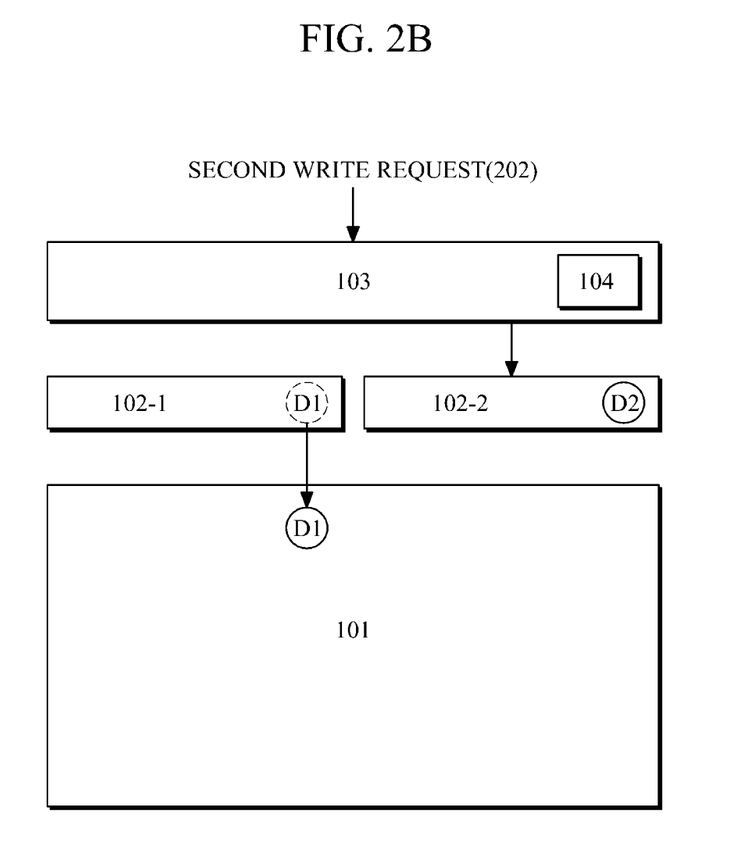
Figure 2C:
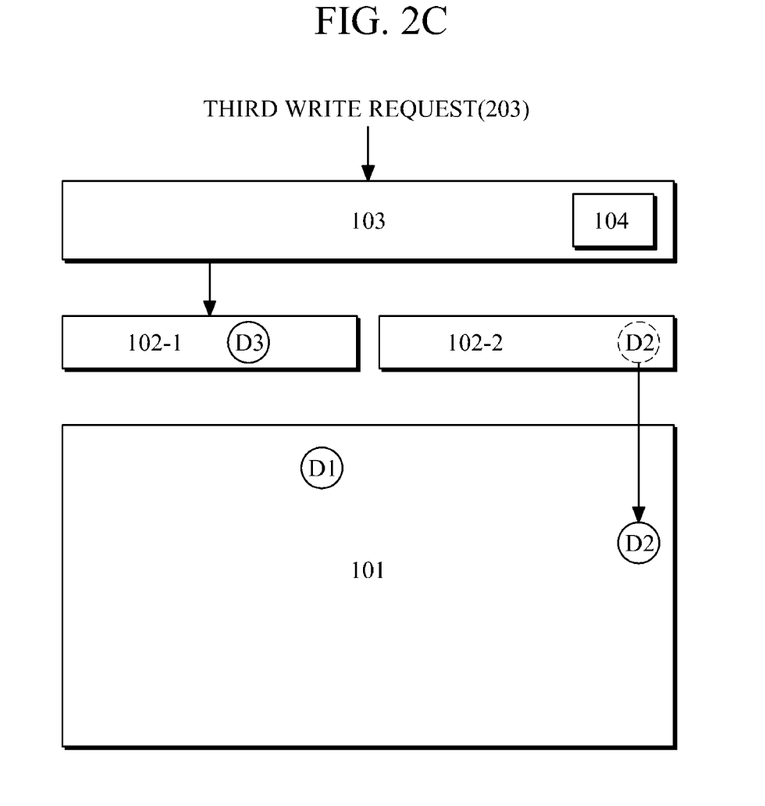

FIGS. 2A to 2C show an operation of an example of an apparatus for storing data.

As shown in FIG. 2A, upon receiving a first write request 201, the controller 103 may select the first non-volatile buffer 102-1 as an available non-volatile buffer with reference to the buffer-status information 104 and may store first data D1 corresponding to the first write request 201 in the first non-volatile buffer 102-1. At this time, the controller 103 may add an error detection code (EDC) to the first data D1 to be stored in the first non-volatile buffer 102-1 and may update the buffer-status information 104.

As shown in FIG. 2B, upon receiving a second write request 202, the controller 103 may select the second non-volatile buffer 102-2 as an available non-volatile buffer with reference to the buffer-status information 104 and may store second data D2 corresponding to the second write request 202 in the second non-volatile buffer 102-2. Similarly, the controller 103 may add an error detection code (EDC) to the second data D2 to be stored in the second non-volatile buffer 102-2 and may update the buffer-status information 104. While storing the second data D2 in the second non-volatile buffer 102-2, the controller 103 may control the first non-volatile buffer 102-1 such that the first data D1 stored in the first non-volatile buffer 102-1 is transferred to the memory cell 101. At this time, the controller 103 updates the buffer-status information 104.

As shown in FIG. 2C, upon receiving a third write request 203, the controller 103 selects the first non-volatile buffer 102-1 as an available non-volatile buffer with reference to the buffer-status information 104. In response to the data D1 in the first non-volatile buffer 102-1 having been written to the memory cell 101 and the buffer status information 104 has been updated, the controller 103 may select the first non-volatile buffer 102-1 as an available non-volatile buffer. The controller 103 may store third data D3 corresponding to the third write request 203 in the first non-volatile buffer 102-1. Similarly, the controller 103 may add an error detection code to the third data D3. While storing the third data D3, the controller 103 may control the second non-volatile buffer 102-2 such that the second data D2 stored in the second non-volatile buffer 102-2 is transferred to the memory cell 101, and then may update the buffer-status information 104.

As shown in FIGS. 2A to 2C, the data D1 may be temporarily stored in the non-volatile buffer 102-1, and the data D1 may be written into the memory cell 101. In addition, the writing of the data D1, which may have been stored in the non-volatile buffer 102-1, into the memory cell 101 may be simultaneously performed with the storing of the data D2 in the non-volatile buffer 102-2.

As described above, as data may be written through two steps using the non-volatile buffers 102-1 and 102-2, the atomicity of data may be ensured during power shutdown. In addition, the non-volatile buffers 102-1 and 102-2 may operate in a parallel manner, so the latency in two step operations may be reduced.

Figure 3:
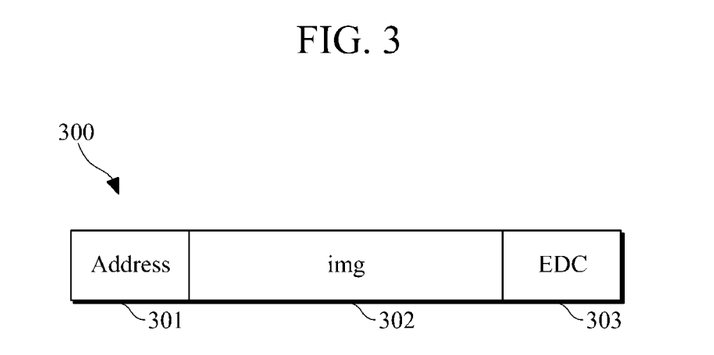
FIG. 3 is an example of a data structure.

FIG. 3 shows an example of a data structure stored in a non-volatile buffer.

As shown in FIG. 3, Address 301 indicates a write location or a read location in the memory cell 101 for data 300, img 302 indicates the content or value of the data 300, and EDC 303 indicates an error detection code.

EDC 303 may be information used to determine the deficiency of the data 300 or the is existence of an error in the data 300. For example, when a power supply is removed when a data I/O request is processed, the EDC 303 may be set to "0". In the opposite situation, the EDC 303 may be set to "1". These are only examples, for instance, "0" and "1" may be reversed.

In response to the data 300 being stored in the non-volatile buffers 102-1 and 102-2, the controller 103 may set EDC 303 or may add the EDC 303. When a system is turned on or reset, the controller 103 may initialize the non-volatile buffers 102-1 and 102-2 based on the EDC 303. For example, in regard to the initialization, the controller 103 may check the EDC 303 of data stored in the non-volatile buffers 102-1 and 102-2, determining erroneous data if an EDC 303 is found to be set to "0" due to power shutdown and thus deleting the corresponding data.

Figure 4:
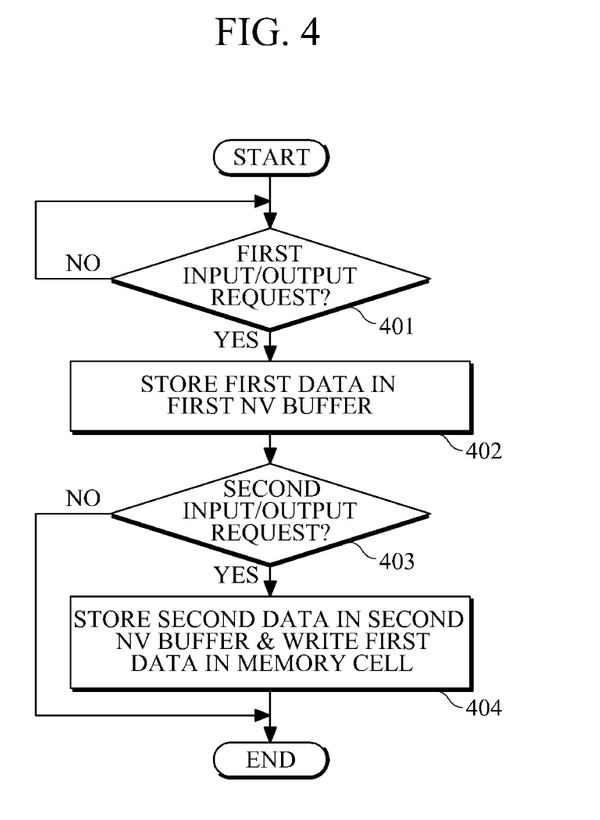
FIG. 4 is an example of a method of storing data.

FIG. 4 shows an example of a method of storing data.

As shown in FIG. 4, with reference to FIG. 1, in operation 401, the first I/O request may be received. In operation 402, a first data corresponding to the received first I/O request may be stored in a first non-volatile buffer. For example, referring again to FIG. 2A, the controller 103 may store the first data D1 in the first non-volatile buffer 102-1 with reference to the buffer status information 104.

In operation 403, upon receiving the second I/O request, the data stored in the first non-volatile buffer may be written into a memory cell, while in operation 404, second data corresponding to the received second I/O request may be being stored in the second non-volatile buffer. For example, referring again to FIGS. 2B and 2C, the controller 103 may store the second data D2 in the second non-volatile buffer 102-1 with reference to the buffer status information 104 and may transfer the data D1 stored in the first non-volatile buffer 102-1 into the memory cell 101.

Figure 5:
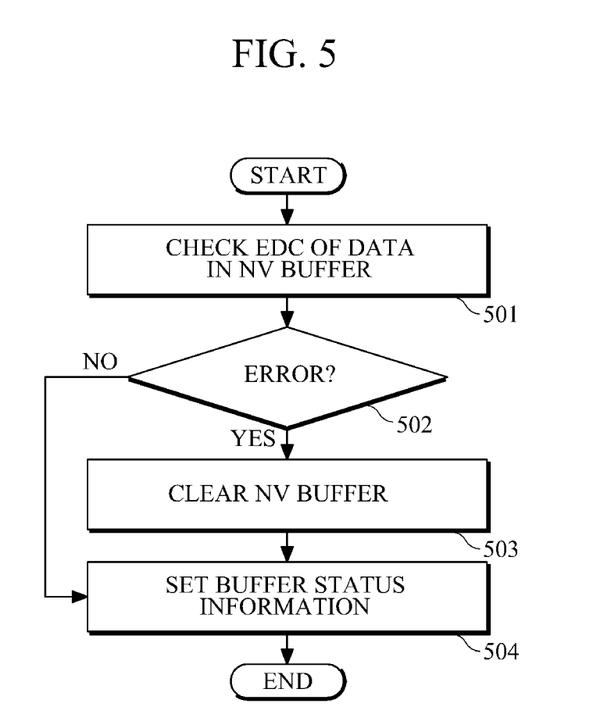
FIG. 5 is an example of a method of initializing a buffer.

FIG. 5 shows an example of a method of initializing a buffer.

As shown in FIG. 5, with reference to FIG. 1, in operation 501, in response to a system being turned on or reset from an abnormal shutdown, the controller 103 may check the presence of data on each non-volatile buffer and the error detection code. In operation 502, the controller 103 may determine the occurrence of an error based on the error detection code. In operation 503, in response to an error occurring in data residing on a predetermined non-volatile buffer, the controller 103 may delete the erroneous data from the non-volatile buffer. In operation 504, the controller 103 may set the buffer status information 104 indicating the availability of each non-volatile buffer and may complete the initialization.

Figure 6:
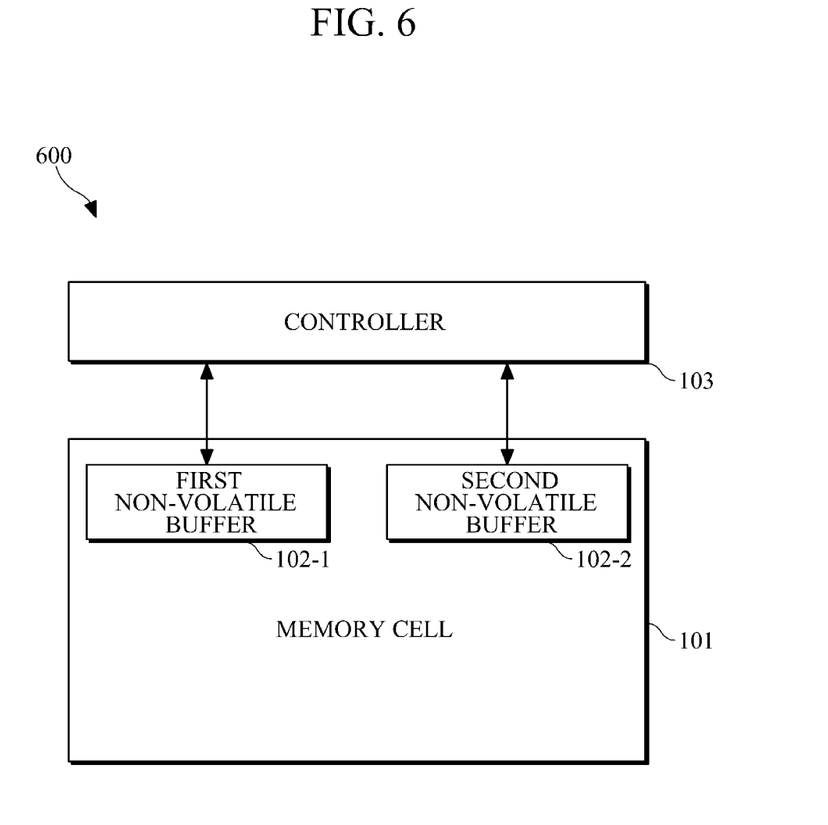
FIG. 6 is another example of an apparatus for storing data.

FIG. 6 shows another example of an apparatus for storing data.

As shown in FIG. 6, with reference to FIG. 1, a data storing apparatus 600 may include a memory cell 101, a plurality of non-volatile buffers 102-1 and 102-2, and a controller 103. The memory cell 101, the non-volatile buffers 102-1 and 102-2, and the controller 103 correspond to those described above with reference to FIGS. 1 to 5.

As shown in FIG. 6, the memory cell 101 may be integrally formed with the non-volatile buffers 102-1 and 102-2. For example, the memory cell 101 may be integrally formed with the non-volatile buffers 102-1 and 102-2 by using some of a plurality of non-volatile elements in the memory cell 101 as the non-volatile buffers 102-1 and 102-1.

Figure 7:
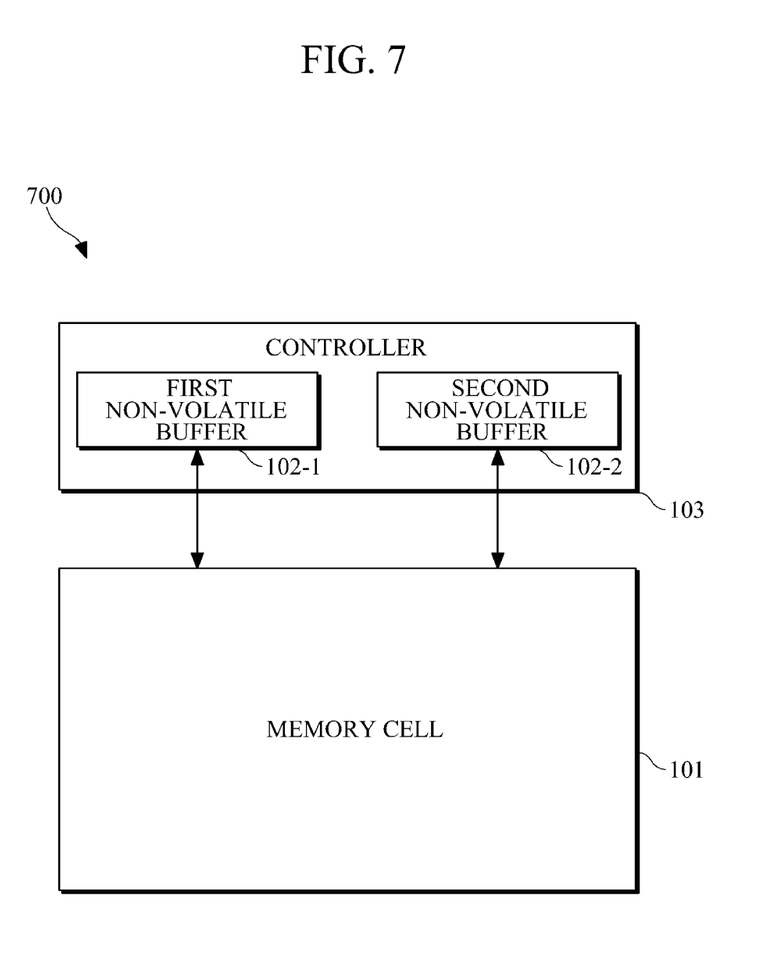
FIG. 7 is still another example of an apparatus for storing data.

FIG. 7 shows still another example of an apparatus for storing data.

As shown in FIG. 7, a data storing apparatus 700 may include a memory cell 101, a plurality of non-volatile buffers 102-1 and 102-2, and a controller 103. The memory cell 101, the non-volatile buffers 102-1 and 102-2, and the controller 103 correspond to those described with reference to FIGS. 1 to 5.

As shown in FIG. 7, the controller 103 may be integrally formed with the non-volatile buffers 102-1 and 102-2. For example, the controller 103 may be integrally formed with the non-volatile buffers 102-1 and 102-2 by forming a plurality of non-volatile elements serving as a buffer inside the controller 103.

The processes, functions, methods and/or software described above may be recorded, stored, or fixed in one or more computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of computer-readable media include magnetic media, such as hard disks, floppy disks, and magnetic tape; optical media such as CD-ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The described hardware devices may be configured to act as one or more software modules in order to perform the operations and methods described above, or vice versa. In addition, a computer-readable storage medium may be distributed among computer systems connected through a network and computer-readable codes or program instructions may be stored and executed in a decentralized manner.

A computing system or a computer may include a microprocessor that is electrically connected with a bus, a user interface, and a memory controller. It may further include a flash memory device. The flash memory device may store N-bit data via the memory controller. The N-bit data is processed or will be processed by the microprocessor and N may be 1 or an integer greater than 1. Where the computing system or computer is a mobile apparatus, a battery may be additionally provided to supply operation voltage of the computing system or computer.

It will be apparent to those of ordinary skill in the art that the computing system or computer may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Flash memory devices and/or memory controllers may be included in various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. For example, the memory controllers may be constructed to communicate with an external device for example, a host using any one of various types of interface protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a DVD, a router, and a Global Positioning System (GPS).

A number of example embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus configured to store data using a non-volatile buffer, the apparatus comprising:
    a memory cell;
    at least two non-volatile buffers configured to store the data to be written into the memory cell, the at least two non-volatile buffers comprising a first non-volatile buffer and a second non-volatile buffer; and
    a controller configured to:
        store first data in the first non-volatile buffer according to a first input/output (I/O) request, the first data to be written into the memory cell
        control the first non-volatile buffer to write the first data stored in the first non volatile buffer into the memory cell, and
        store second data in the second non-volatile buffer according to a second input/output (I/O) request at a same time as the controlling of the first non-volatile buffer, the second data to be written into the memory cell.

2. The apparatus of claim 1, wherein the controller is further configured to:
    add an error detection code (EDC) to each of the first data and the second data stored in the first non-volatile buffer and the second non-volatile buffer, respectively.

3. The apparatus of claim 2, wherein the controller is further configured to:
    initialize the the first non-volatile buffer and the second non-volatile buffer based on the error detection code of each of the first data and the second data stored in the first non-volatile buffer and the second non-volatile buffer, respectively.

4. The apparatus of claim 1, wherein the controller comprises status information corresponding to the at least two non-volatile buffers.

5. The apparatus of claim 4, wherein the status information indicates an availability of each of the at least two non-volatile buffers.

6. The apparatus of claim 1, wherein the memory cell is integrally formed with the at least two non volatile buffers.

7. The apparatus of claim 1, wherein the controller is integrally formed with the at least two non volatile buffers.

8. The apparatus of claim 1, wherein the controller is further configured to:
    control the second non-volatile buffer to write the second data stored in the second non volatile buffer into the memory cell; and
    store third data in the first non-volatile buffer according to a third input/output (I/O) request at a same time as the controlling of the second non-volatile buffer, the third data to be written into the memory cell.

9. The apparatus of claim 1, wherein each of the first and second data stored in the first non-volatile buffer and the second non-volatile buffer, respectively, comprises an error detection code (EDC).

10. The apparatus of claim 9, wherein the controller is further configured to:
    initialize the the first non-volatile buffer and the second non-volatile buffer based on the error detection code of each of the first data and the second data stored in the first non-volatile buffer and the second non-volatile buffer, respectively.

11. A method of storing data using a non-volatile buffer, the method comprising:

storing first data in a first non-volatile buffer according to a first input/output (I/O) request, the first data to be written into a memory cell;

writing the first data stored in the first non-volatile buffer into the memory cell; and storing second data in a second non-volatile buffer according to a second input/output (I/O) request at a same time as the writing of the first data, the second data to be written into the memory cell.

12. The method of claim 11, wherein each of the first and second data stored in the first non-volatile buffer and the second non-volatile buffer, respectively, comprises an error detection code (EDC).

13. The method of claim 12, further comprising:

initializing the first non-volatile buffer and the second non-volatile buffer based on the error detection code of each of the first data and the second data stored in the first non-volatile buffer and the second non-volatile buffer, respectively.

14. The method of claim 11, further comprising:

adding an error detection code (EDC) to each of the first and second data stored in the first non-volatile buffer and the second non-volatile buffer, respectively.

15. The method of claim 14, further comprising:

initializing the first non-volatile buffer and the second non-volatile buffer based on the error detection code of each of the first data and the second data stored in the first non-volatile buffer and the second non-volatile buffer, respectively.

16. The method of claim 11, further comprising:

writing the second data stored in the second non-volatile buffer into the memory cell; and storing third data in the first non-volatile buffer according to a third input/output (I/O) request at a same time as the writing of the second data, the third data to be written into the memory cell.

17. An apparatus configured to store data using a non-volatile buffer, the apparatus comprising:

a memory cell;

at least two non-volatile buffers configured to store the data to be written into the memory cell; and a controller configured to:

upon initialization, examine the data of each of the at least two non-volatile buffers for a respective error correction code (EDC), and in response to the EDC indicating an error occurring, delete the data from a respective one of the at least two non-volatile buffers that comprises the EDC indicating the error occurring.

18. The apparatus of claim 17, wherein the controller is further configured to:

set buffer status information indicating an availability of each of the at least two non-volatile buffers.

* * * * *